United States Patent
Maltsev et al.

(10) Patent No.: US 7,336,716 B2
(45) Date of Patent: Feb. 26, 2008

(54) POWER AMPLIFIER LINEARIZATION METHODS AND APPARATUS USING PREDISTORTION IN THE FREQUENCY DOMAIN

(75) Inventors: Alexander A. Maltsev, Nizhny Novgorod (RU); Ali S Sadri, San Diego, CA (US); Oleg V. Poldin, Nizhny Novgorod (RU); Alexander A. Maltsev, Nizhny Norgorod (RU); Sergey Purtsezov, Nizhegorodskaya oblast (RU)

(73) Assignee: Intel Corporation, Santa Clara, CA (US)

( * ) Notice: Subject to any disclaimer, the term of this patent is extended or adjusted under 35 U.S.C. 154(b) by 485 days.

(21) Appl. No.: 10/881,731

(22) Filed: Jun. 30, 2004

(65) Prior Publication Data

US 2006/0008028 A1 Jan. 12, 2006

(51) Int. Cl.
*H04K 1/10* (2006.01)
*H04L 25/03* (2006.01)

(52) U.S. Cl. .................... 375/260; 375/296
(58) Field of Classification Search ............ 375/260, 375/296, 297; 455/126
See application file for complete search history.

(56) References Cited

U.S. PATENT DOCUMENTS 4,700,151 A 10/1987 Nagata et al.
6,819,720 B1* 11/2004 Willetts .......... 375/296
7,085,330 B1* 8/2006 Shirali .......... 375/296
7,106,806 B1* 9/2006 Kenington .......... 375/297
2003/0156657 A1 8/2003 Schrader et al.
2004/0116083 A1* 6/2004 Suzuki et al. .......... 455/126
2006/0141955 A1* 6/2006 Karjalainen et al. ..... 455/114.3

FOREIGN PATENT DOCUMENTS

WO WO-2006/012306 A1 2/2006

OTHER PUBLICATIONS

Muhonen, K J., "Look-up table techniques for adaptive digital predistortion: a development and comparison", *IEEE Transactions on Vehicular Technology*, 49(5), (Sep. 2000), 1995-2002.
Raab, Frederick H., "Power amplifiers and transmitters for RF and microwave", *IEEE Transactions on Microwave Theory and Techniques*, 50(3), (Mar. 2002), 814-826.
"International Search Report for corresponding PCT Application No. PCT/US2005/022512", (Nov. 16, 2005), 3 pgs.

* cited by examiner

*Primary Examiner*—Don N. Vo
(74) *Attorney, Agent, or Firm*—Schwegman, Lundberg & Woessner, P.A.

(57) ABSTRACT

To mitigate the effects of non-linear amplification in a digital transmission system employing a multi-carrier multiplexing communications technique, such as orthogonal frequency division multiplexing or discrete multi-tone, predistortion of an input signal to a power amplifier with a non-linear transfer characteristic is performed in the frequency domain by modifying frequency-domain symbols used to modulate individual sub-carriers. The frequency-domain symbols are modified in a manner that compensates for the amplifier's non-linear transfer characteristic.

46 Claims, 7 Drawing Sheets

US 7,336,716 B2

POWER AMPLIFIER LINEARIZATION METHODS AND APPARATUS USING PREDISTORTION IN THE FREQUENCY DOMAIN

TECHNICAL FIELD

Various embodiments described herein relate to wireless communications generally and, more specifically, to power amplifier linearization methods and apparatus using predistortion in the frequency domain.

BACKGROUND INFORMATION

Multicarrier modulation techniques, such as orthogonal frequency-division multiplexing (OFDM) and discrete multi-tone (DMT), are now widely used for high-speed communications over bandpass communications channels. Examples of their use include the broadcasting of digital audio and video. They further include implementations of the physical layer for wireless networking standards, e.g., Institute of Electrical and Electronics Engineers (IEEE) standards 802.11a, g, j, n, and 802.16.

OFDM and DMT systems are merely two examples of multiple-carrier wireless communication systems utilizing multiplexing techniques. Such multi-carrier systems employ multiple-access techniques to transmit content across a wireless communications channel comprising a number (greater than one) of sub-carriers.

An OFDM system uses several low-rate sub-carriers to transmit data. The frequencies of the sub-carriers and the symbol period are chosen so that the sub-carriers are orthogonal over the symbol period and do not interfere with one another. In an OFDM system, the data is split into N streams, which are then used to independently modulate closely-spaced sub-carrier frequencies or tones in parallel. In the applications mentioned above, N is typically 64 or more. The frequency separation between the sub-carriers is 1/T, where T is the OFDM symbol time duration.

Practical systems use an inverse-discrete-Fourier transform (implemented as an inverse Fast Fourier Transform or IFFT) to generate a sampled version of a composite time-domain signal that can be converted to a signal suitable for radio transmission. The most distinct advantage of OFDM over single-carrier modulation is the longer symbol period for a given data rate, which inherently mitigates inter-symbol interference in time-dispersive channels without having to resort to elaborate equalization techniques.

However, because an OFDM signal is the sum of multiple sinusoidal waves, high-amplitude peaks in the composite time-domain signal occur when the signals from different tones add constructively. Compared with the average signal power, the instantaneous power of these peaks is high, which means that the signal has a high peak-to-average power ratio (PAPR). The occurrence of these peaks may seriously hamper practical implementations and is generally considered to be a significant challenge of OFDM.

In order to transmit an OFDM signal, the energy of the time-domain signal must be increased by a power amplifier. However, a high PAPR means that the OFDM signal is sensitive to any non-linearities exhibited by the transfer characteristic of the power amplifier. It is possible to reduce the PAPR by using special coding techniques for encoding the data that result in OFDM signals with a low PAPR, but this does not eliminate the problem.

DETAILED DESCRIPTION

In the following detailed description of embodiments of the inventive subject matter, reference is made to the accompanying drawings that form a part hereof, and in which are shown by way of illustration specific preferred embodiments in which the inventive subject matter may be practiced. These embodiments are described in sufficient detail to enable those skilled in the art to practice the inventive subject matter. It is to be understood that other embodiments may be utilized and that structural, mechanical, compositional, electrical, and procedural changes may be made without departing from the spirit and scope of the inventive subject matter. The following detailed description is, therefore, not to be taken in a limiting sense, and the scope of the inventive subject matter is defined only by the appended claims.

Figure 1:
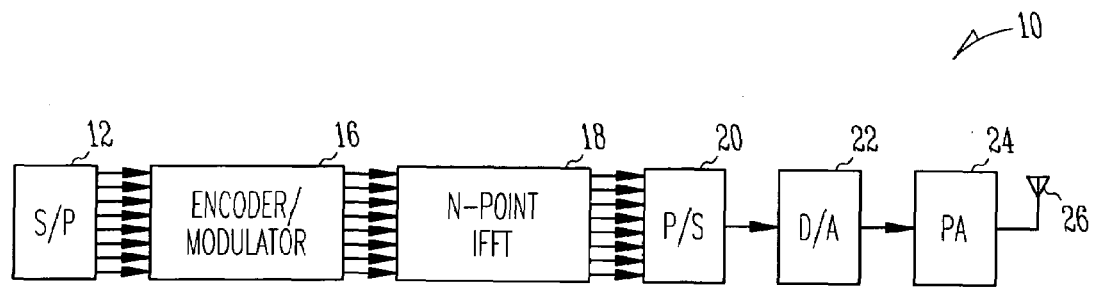
FIG. 1 is a block diagram illustrating a known OFDM transmitter including a power amplifier.

FIG. 1 is a block diagram illustrating a known OFDM transmitter 10 including a power amplifier 24.

OFDM transmitter 10 comprises a serial-to-parallel converter 12 to convert a stream of input bits into N parallel streams. Groups of bits within each parallel stream are then encoded into a block of N complex-valued symbols by encoder/modulator 16, where the complex-valued symbols correspond to the constellation points of a modulation system such as QAM (quadrature amplitude modulation). Because these complex-valued symbols are used to determine the amplitude and phase of a particular sub-carrier, they are referred to herein as "frequency-domain symbols".

The N frequency-domain symbols are each a complex number, representing a plurality of the input bits, and they are input into an N-point inverse fast Fourier transform (IFFT) 18. Next, they are converted to a serial discrete-time signal by parallel-to-serial converter 20.

The resulting discrete-time signal thus constitutes N samples of a time-domain waveform representing a sum of orthogonal sub-carrier waveforms, with each sub-carrier waveform being modulated by a frequency-domain symbol. These N samples are referred to as an "OFDM symbol" or "OFDM block". OFDM symbols are sometimes referred to as meta-symbols, to be distinguished from the frequency-domain symbols to which the input data is directly mapped.

The time-domain waveform samples are converted into an analog waveform by digital-to-analog converter 22 in order to drive a power amplifier 24 and to transmit the time-domain waveform over a communications channel using, for example, an antenna 26.

At a suitable receiver (not illustrated), the time-domain waveform are then re-sampled and discrete-Fourier-transformed to recover the frequency-domain symbols, which symbols are decoded to generate the input data stream.

In practice, the number of frequency-domain symbols, or data sub-carriers, is somewhat less than the total number of sub-carriers. This is done both to prevent aliasing and to provide pilot carriers that may be used for synchronization.

Also, a guard interval may be provided for each OFDM symbol, in order to provide enhanced immunity to multi-path distortion. To preserve the orthogonality of the sub-carriers, the guard interval may be in the form of a cyclic prefix. The cyclic prefix may be established as a copy of the last part of an OFDM symbol, and the duration may be made just larger than the maximum excess delay of the multi-path channel. The cyclic prefix may be removed at the receiver prior to discrete Fourier transformation and recovery of the frequency-domain symbols.

As mentioned earlier, the non-linear transfer characteristic of a power amplifier in an OFDM transmitter may introduce distortion into the transmitted signal. Amplifiers may operate as linear devices under small signal conditions, but they may become more non-linear and distorting with increasing input signal level. An OFDM signal is sensitive to these non-linear distortions because of its widely variable envelope, which depends upon the instantaneous phase value of each carrier.

The amplifier signal levels may be reduced or "backed off" to mitigate the problem, but this may result in reduced efficiency and/or reduced coverage area for the transmitter. At the input signal levels required for practical operation, therefore, the non-linear transfer characteristic of a power amplifier introduces distortion, or some equivalent noise, into the transmitted signal. The distortion varies with the amplitude of the input signal. This noise produces both amplitude distortion ("AM/AM") and phase distortion ("AM/PM") of the output signal to an extent that depends upon the amplitude of the input signal.

Figure 2:
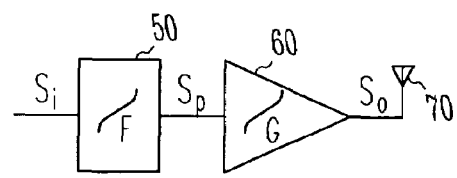
FIG. 2 illustrates an input signal being predistorted in a manner complementary to a non-linear transfer characteristic of a power amplifier, in accordance with an embodiment of the inventive subject matter.

FIG. 2 illustrates an input signal $S_i$ being predistorted in a manner complementary to a non-linear transfer characteristic of a power amplifier, in accordance with an embodiment of the inventive subject matter. The general principle is that amplifier-generated noise may be eliminated if the input signal is predistorted in a manner complementary to the non-linear transfer characteristic of the power amplifier.

In FIG. 2, an input signal $S_i$ is input to a predistorter 50 with a non-linear transfer characteristic F to result in a predistorted signal $S_p$ which is then input to a power amplifier 60 with non-linear transfer characteristic G to produce an output signal $S_o$ that may be transmitted from an antenna 70.

Ideally, the transfer characteristic F of the predistorter 50 is such that:

$$G(F(S_i))=K \cdot S_i, \text{ when } S_i<(S_i)_{max}, \text{ and}$$

$$G(F(S_i))=K \cdot (S_i)_{max}, \text{ when } S_i>(S_i)_{max},$$

where $(S_i)_{max}$ is the input value that drives the power amplifier output to a saturation level, and K is the gain. Thus, the combination of the two non-linearities results in an overall linear transfer function in the given range of the input signal, $S_i<(S_i)_{max}$.

Predistortion techniques that have attempted to achieve the ideal result illustrated by FIG. 2 have previously been implemented in the time-domain. In a digital time-domain predistorter, for example, the amplitude and phase of each input sample is adjusted before being converted to analog form and input to the power amplifier.

The non-linear distortion by a power amplifier can also be modeled by its effects within the frequency domain. The non-linear distortion noise in an OFDM signal introduced by a power amplifier manifests itself in the frequency domain as amplitude and phase distortions spread among the sub-carriers, as well as the generation of additional spectral components due to what is referred to as "inter-modulation distortion". The amplitude and phase distortion of the sub-carriers is in-band distortion that is responsible for the increase in bit error rate brought about by the non-linear effects of the power amplifier. The generation of additional spectral components can also result in out-of-band distortion, which may interfere with adjacent communications channels.

In the inventive subject matter, both of these effects are dealt with directly by performing predistortion in the frequency domain. The time-domain OFDM symbols are predistorted by modifying the frequency-domain symbols in a manner that compensates for the non-linear transfer characteristic of the power amplifier.

Prior to a discussion of the FIG. 3 exemplary embodiment, a brief explanation of frequency-domain predistortion in an embodiment of an OFDM system in accordance with the inventive subject matter will now be given.

In such an embodiment, data encoded as symbols corresponding to the constellation points of a modulation system such as QAM (quadrature amplitude modulation), QPSK (quadriphase shift keying), or BPSK (binary phase shift keying) is transmitted on parallel-modulated sub-carriers.

The modulated sub-carriers are summed together to form a transmittable composite signal that can be demodulated at a receiver. The frequencies of the sub-carriers are selected so that the sub-carriers are orthogonal (i.e., uncorrelated) over the symbol period in order to allow both spectral overlap of the sub-carriers and recoverability of the symbols. Orthogonality of the sub-carriers can be achieved if the symbol period contains an integer number of cycles of each sub-carrier.

An OFDM signal with minimal spacing between the sub-carriers can be produced in the following manner. Let N be the number of sub-carriers, let C[k] for k=0 to N-1 be the complex symbols that are to be transmitted simultaneously, and let $NT_s$ be the OFDM symbol duration. The samples S[n] for n=0 to N-1 of a complex-enveloped OFDM baseband signal S(t) taken at a sampling period of $T_s$ over one symbol interval $NT_s$ can then be expressed as:

$$S[n] = \frac{1}{N} \sum_{k=0}^{N-1} C[k] e^{\left(\frac{2\pi j n k}{N}\right)}$$

Modulation of OFDM signals is suitably performed by an inverse-discrete-Fourier transform, and a discrete Fourier transform is used to recover the C[k] symbols. The orthogonal basis functions of the discrete Fourier transform constitute the sub-carriers, and quadrature techniques are used to generate a real-valued time-domain signal from the complex-valued exponentials. The discrete Fourier transform and its inverse are preferably implemented by a fast Fourier transform algorithm (FFT).

Predistortion may be performed in the frequency domain by modifying the frequency-domain symbols prior to their being used to modulate the sub-carriers and to produce the composite time-domain waveform.

In an exemplary implementation, the inverse-discrete-Fourier transform is used to produce samples of the composite time-domain waveform from the frequency-domain symbols, and the predistortion of the time-domain waveform occurs prior to inverse-discrete-Fourier transformation while in the frequency domain. The original frequency-domain symbols are replaced with predistorted symbols which, when transformed to the time-domain, compensate for the amplitude and phase errors introduced by the non-linear power amplifier. The predistortion symbols may be derived from multiple convolutions of frequency-domain symbols multiplied by coefficients of a polynomial approximation to a transfer characteristic that is inverse to that of the power amplifier.

The modification of the frequency-domain symbols may be performed in accordance with a polynomial approximation of a function $F(S_i)$ that is inverse to the non-linear transfer characteristic of the power amplifier:

$$S_p = F(S_i) \approx c_1 S_i + c_3 S_i |S_i|^2 + \ldots + c_L S_i |S_i|^{L-1}.$$

Each term of polynomial function is represented by an input complex signal $S_i$ multiplied by the absolute value of the input complex signal raised to even power, and multiplied by a complex coefficient $c_i$.

The time-domain predistortion terms $c_l S_i |S_i|^{l-1}$, $l=3, 5, \ldots, L$, may be realized through frequency-domain predistortion components $c_l \tilde{C}_l[k]$ as $$(S_i |S_i|^{l-1})[n] = \frac{1}{M} \sum_{k=0}^{M-1} \tilde{C}_l[k] \exp(2\pi j n k / M),$$

where $M = l(N-1)$, and $$\tilde{C}_l[k] = \frac{1}{M^{l-1}} C[k] \otimes (C[k] \otimes C^*[k]) \ldots (C[k] \otimes C^*[k])$$

$$= \frac{1}{M^{l-1}} \sum_{n_1=0}^{N-1} \cdots \sum_{n_l=0}^{N-1} C_{k-n_1-\ldots-n_l} C_{n_1} \ldots C^*_{n_l},$$

$$k = 0, 1, \ldots, M-1.$$

The frequency-domain predistortion symbols $\tilde{C}_l[k]$ may be applied to any set of the original frequency-domain symbols, determined by choice of k in the range from k=1 to k=M>N. One or more of the original frequency-domain symbols are thus replaced by corresponding predistortion symbols. Predistorting in the frequency domain may also involve adding frequency-domain symbols additional to those generated by encoding the stream of input bits prior to inverse-discrete-Fourier transformation. The otherwise empty sub-carriers produced by an IFFT larger than the number of frequency-domain symbols discussed above are used for this purpose. The additional frequency-domain symbols may be used to compensate for in-band and/or out-of-band frequency components generated by the non-linear transfer characteristic of the power amplifier.

Various algorithms may be used to calculate the frequency-domain predistortion symbols $\tilde{C}_l[k]$. For example, the predistortion symbols may be derived from multiple convolutions of frequency-domain symbols multiplied by coefficients of the polynomial approximation to a transfer characteristic that is inverse to that of the power amplifier. The frequency-domain convolutions may be performed by an inverse-discrete-Fourier transform, multiplication of the time-domain signal, and a discrete Fourier transform. The products of multiplication in the time domain may be contained in a look-up table, where the look-up table is indexed by values of the time-domain signal.

In order for the predistortion to adapt to changes in the amplifier's transfer characteristic over time, such as changes caused by aging and temperature shifts, the polynomial approximation may be updated by comparing an input and an output of the power amplifier. For example, the polynomial approximation may be updated by an adaptive algorithm that optimizes the coefficients of the polynomial approximation in order to minimize a selected criterion such as a mean-square difference between an ideally amplified input signal and an output of the power amplifier. The selected criterion that is minimized may also be a mean-square difference between a sample of the time-domain waveform and a corresponding digitized sample of the output of the power amplifier or a mean-square difference between a frequency-domain symbol and a corresponding frequency-domain symbol recovered from the output signal of the power amplifier.

Figure 3:
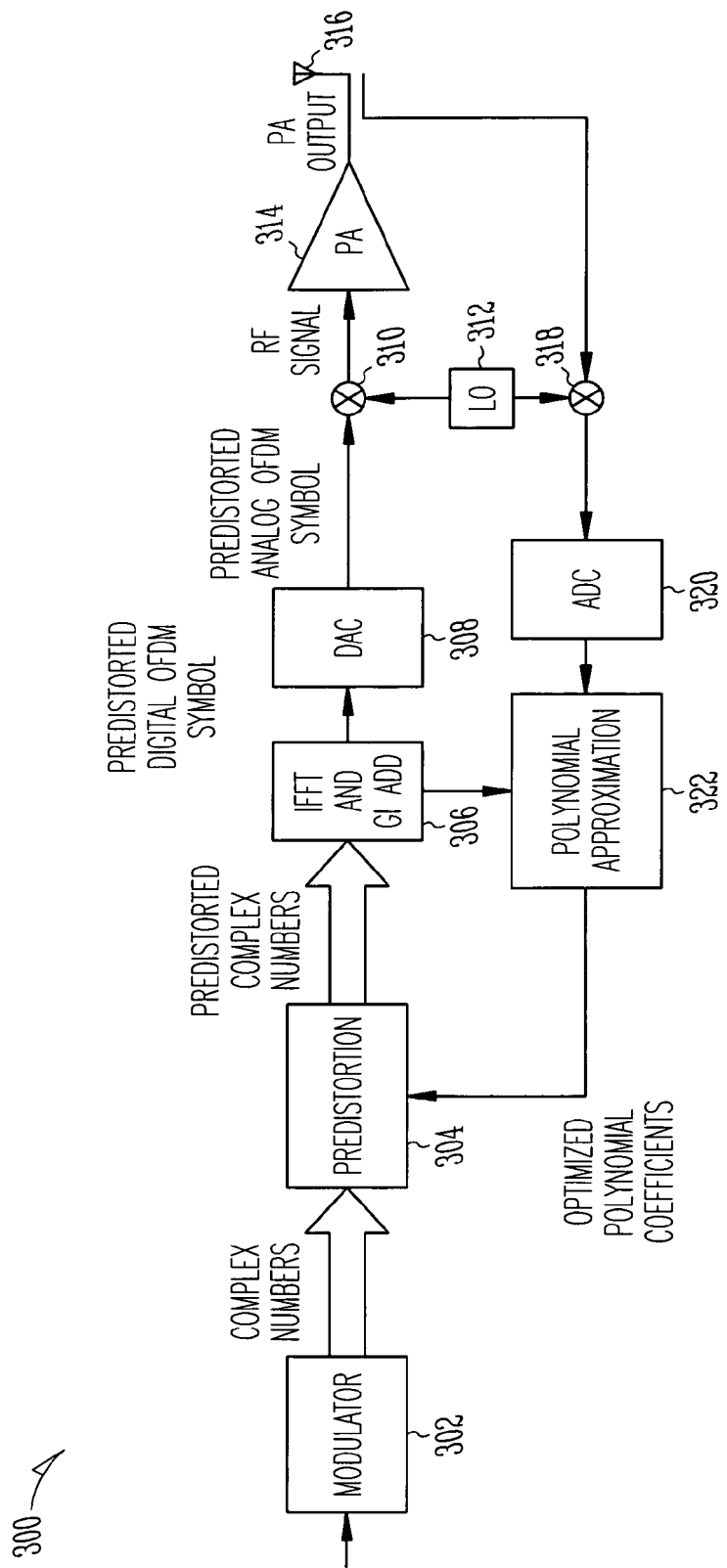
FIG. 3 illustrates an OFDM transmitter employing frequency-domain predistortion, in accordance with an embodiment of the inventive subject matter.

FIG. 3 illustrates an OFDM transmitter 300 employing frequency-domain predistortion, in accordance with an embodiment of the inventive subject matter In various embodiments, the signal processing operations to be described below may be performed by hardware circuitry and components. Or they could be performed by processing elements that execute instructions contained in a processor-readable medium.

In an embodiment, OFDM transmitter 300 comprises an OFDM modulator 302, a predistortion block 304, a block 306 to perform inverse Fast Fourier Transform (IFFT) and to add a guard interval (GI), a digital-to-analog converter (DAC) 308, a first mixer 310, a local oscillator (LO) 312, a power amplifier (PA) 314, an antenna 316, a second mixer 318, an analog-to-digital converter (ADC) 320, and a polynomial approximation block 322.

The OFDM modulator 302 transforms the binary serial input data into groups of N (where N=64 in this example) complex numbers that constitute the frequency-domain symbols. Each frequency-domain symbol represents a constellation point corresponding to the modulation system (e.g., QAM) and is used to modulate a particular sub-carrier of the OFDM symbol.

The N complex numbers go in parallel to the predistortion block 304, which performs the amplitude and phase modifications of the frequency-domain symbols. This predistortion is done on the basis of a polynomial approximation to an inverse function of the power amplifier's transfer characteristics. The operation is performed in the frequency domain, but it is equivalent to processing the input symbol in the time domain by substituting it into the polynomial function F(S) of order L.

The output of the predistortion block 304 is M predistorted complex numbers, which correspond to the N frequency-domain symbols modified with respect to phase and amplitude, as well as additional frequency-domain symbols when M is greater than N. Parameters N and M depend on the non-linearity characteristics of the power amplifier 314, and they should be chosen as a trade-off between the accuracy requirements of any applicable standards (e.g., allowed error vector magnitude and transmit spectrum mask) and computational complexity.

If it is needed to achieve cancellation of out-of-band non-linear distortion, the predistortion block 304 may generate compensating spectral components for both in-band and out-of-band frequencies. For example, the predistortion block 304 may take in N=64 complex amplitudes, but it may output M=64 or M=128 complex amplitudes, corresponding to the size of the IFFT and GI-adding block 306 that follows.

The predistorted digital OFDM symbol complex numbers enter the IFFT and GI-adding block 306, which may perform an inverse Fourier transform of corresponding size (e.g., 64 or 128). The IFFT and GI-adding block 306 may also insert a guard interval (GI) into the formed digital OFDM symbol in the time domain.

The predistorted digital OFDM symbol then goes to the digital-to-analog converter (DAC) 308, and it also goes to the polynomial approximation module 322.

In the digital-to-analog converter (DAC) 308, the predistorted digital OFDM symbol is converted to an analog baseband signal in the form of a predistorted analog OFDM symbol.

The predistorted analog OFDM symbol is next up-converted to an appropriate radio frequency (RF) signal by mixing it in mixer 310 with a carrier frequency generated by local oscillator (LO) 312. The resulting RF signal is then amplified by the power amplifier 314. From power amplifier 314 the RF signal may be processed by further circuitry (not shown), if necessary, before it is transmitted over a suitable antenna 316. The antenna 316 may include an omnidirectional, monopole, dipole, patch, or directional antenna, among others.

In an embodiment, feedback may be used to provide updating information for the non-linear characteristic of the power amplifier 314. A small part of the output of power amplifier 314 may be tapped, down-converted back to baseband by mixing it in mixer 318 with the signal produced by the local oscillator (LO) 312, and converted from analog to digital by analog-to-digital converter (ADC) 320.

The resulting digital signal may then be fed into polynomial approximation module 322, where the inverse function of the amplitude transfer characteristics, $G^{-1}(KS)$, of the power amplifier 314, where K represents the gain, is approximated with polynomial function F(S) of order L. The coefficients of the polynomial are optimized to minimize some criterion. If a mean-squared error criterion is used, then the goal is to minimize the mean-squared difference between the ideally amplified signal and the demodulated output of power amplifier 314. The information on the optimized polynomial coefficients then goes to the predistortion block 304.

Upon reading and comprehending the content of this disclosure, one of ordinary skill in the art will understand the manner in which a software program can be launched from a machine-accessible medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java or C++. Alternatively, the programs can be structured in a procedure-orientated format using a procedural language, such as assembly or C. The software components may communicate using any of a number of mechanisms well known to those skilled in the art, such as application program interfaces or interprocess communication techniques, including remote procedure calls. The teachings of various embodiments are not limited to any particular programming language or environment. Thus, other embodiments may be realized.

Figure 4:
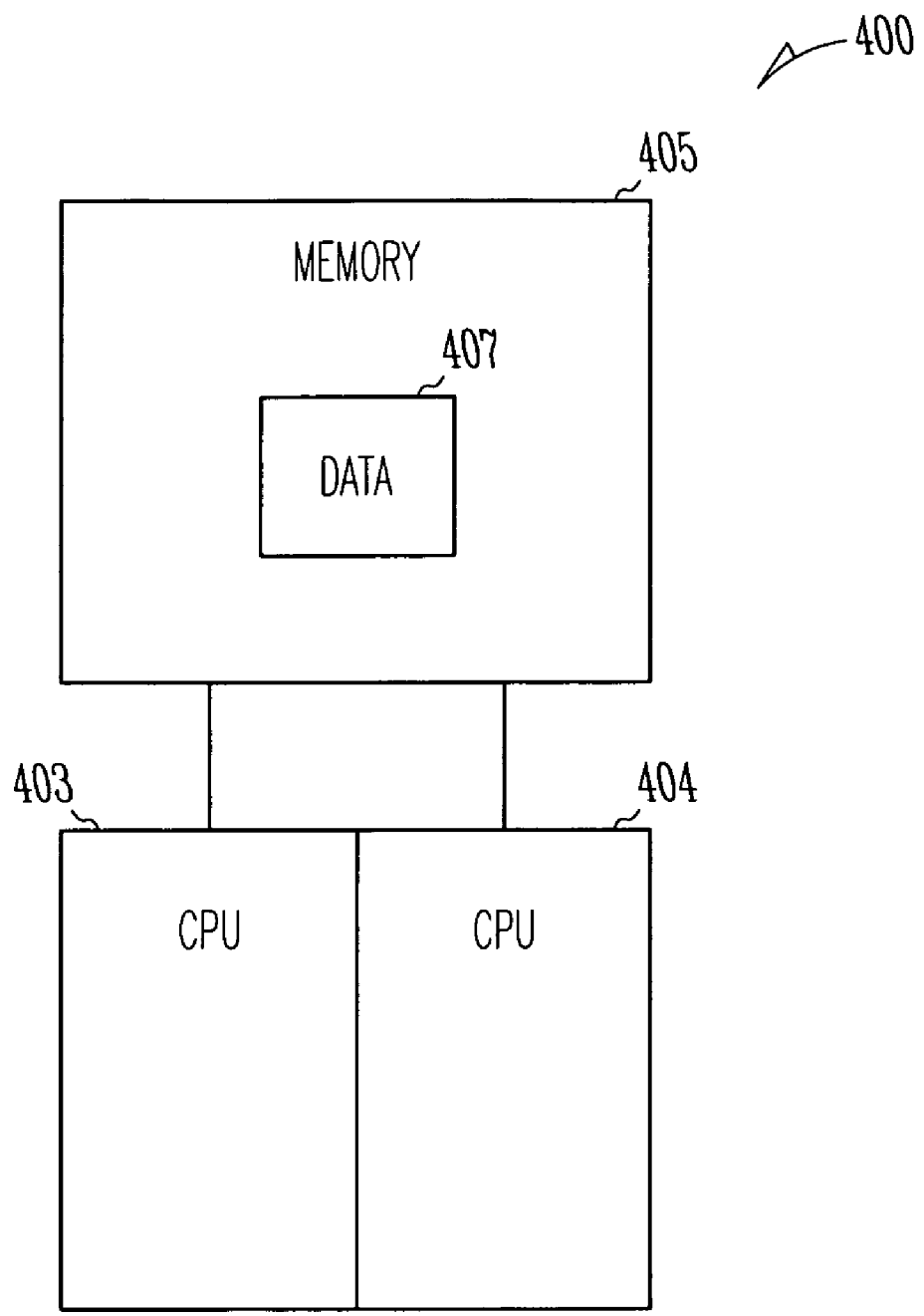
FIG. 4 is a block diagram of an article according to various embodiments of the inventive subject matter.
Figure 5A:
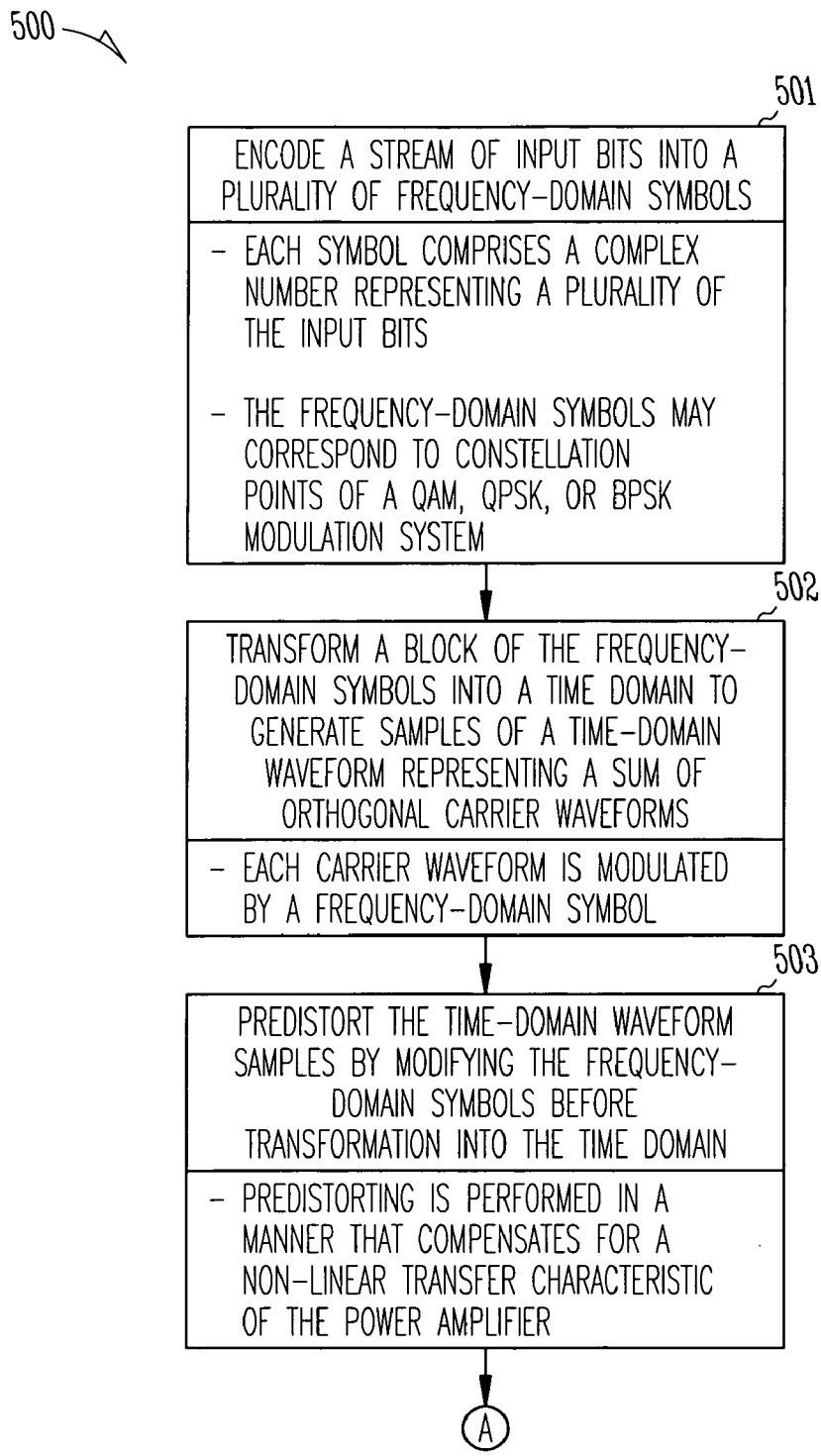
FIGS. 5A, 5B, 5C, and 5D together constitute a flow diagram illustrating several methods according to various embodiments of the inventive subject matter.
Figure 5B:
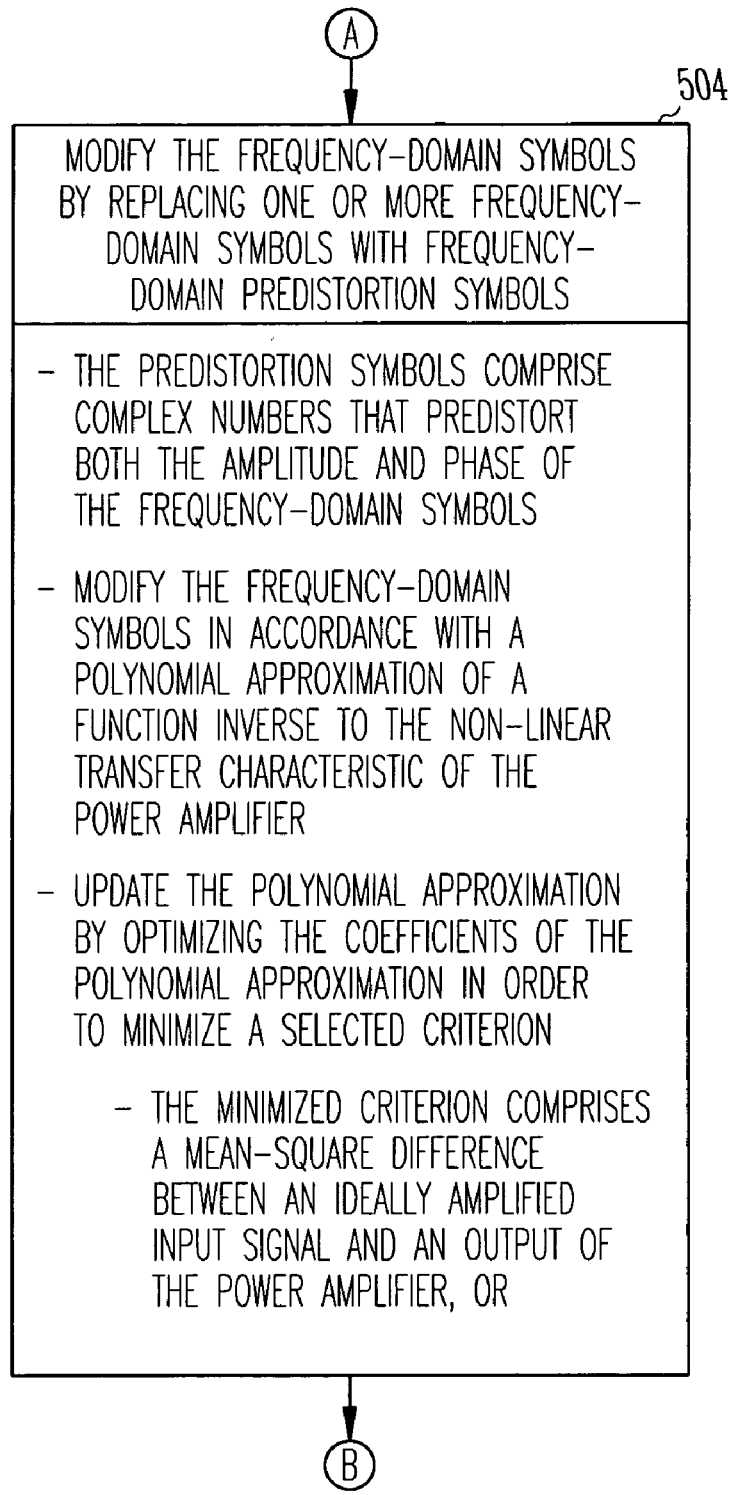
Figure 5C:
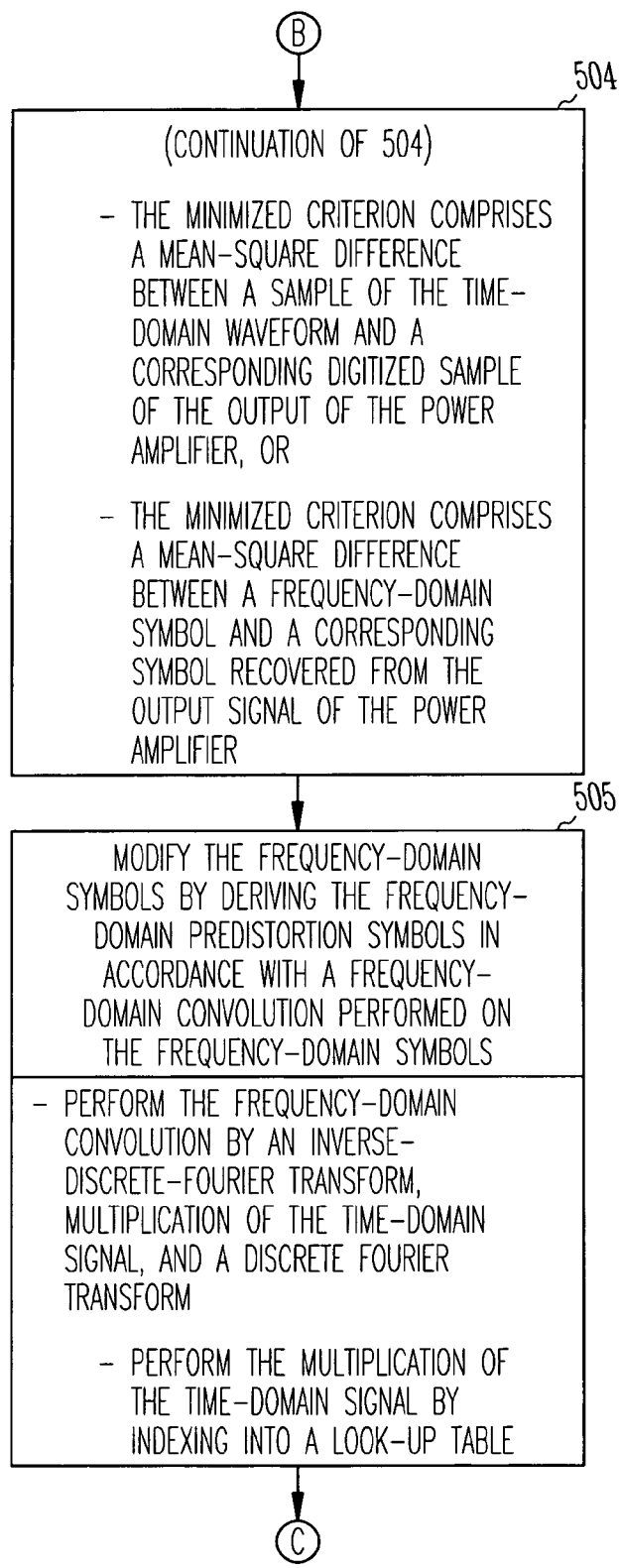
Figure 5D:
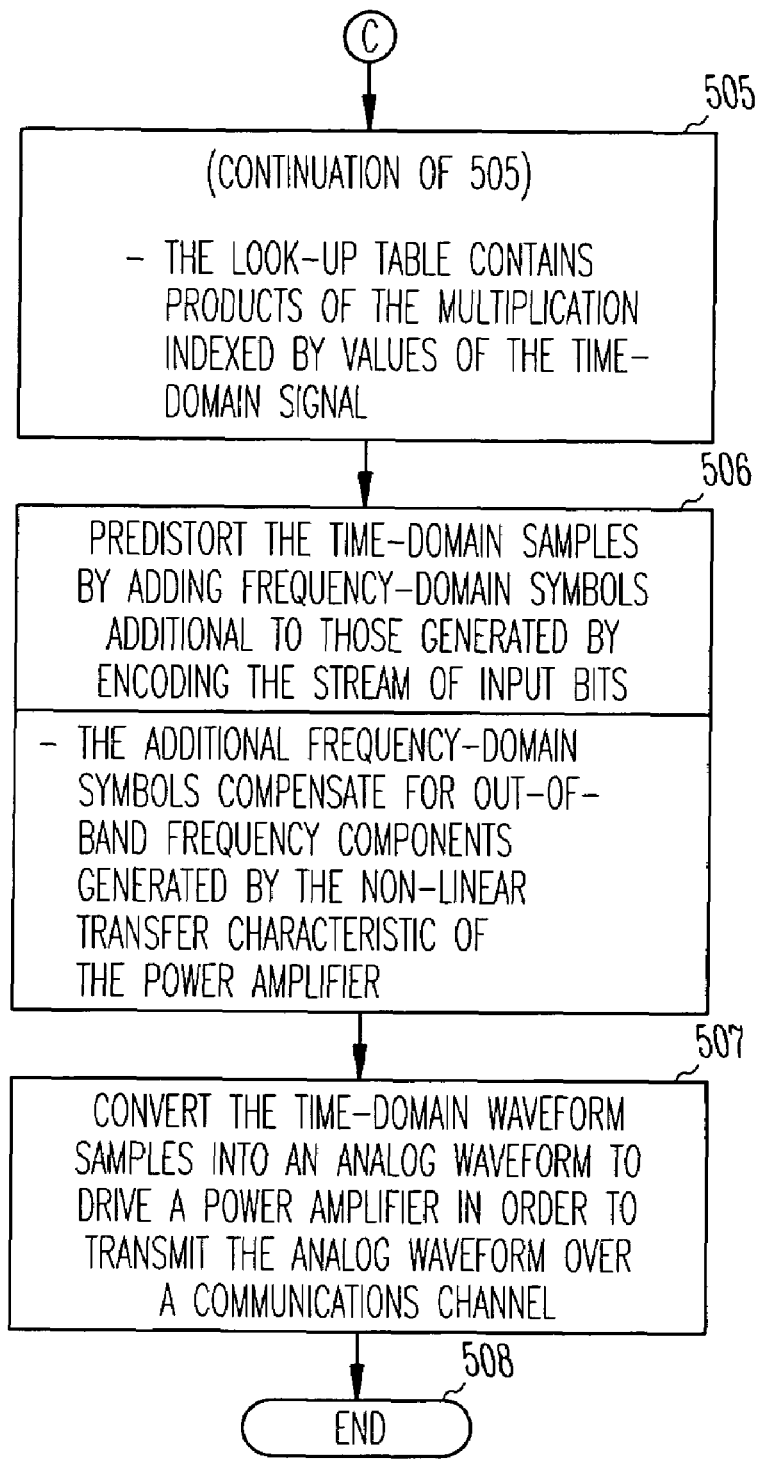

FIG. 4 is a block diagram of an article 400 according to various embodiments of the inventive subject matter. Article 400, according to various embodiments, may comprise a computer, a memory system, a magnetic or optical disk, some other storage device, an integrated circuit, and/or any type of electronic device or system. Article 400 may include at least one processor 403 and/or 404 coupled to a machine-accessible medium such as a memory 405 (e.g., a memory including an electrical, optical, or electromagnetic conductor) having associated information 407 (e.g., computer program instructions and/or data), which, when accessed, results in a machine (e.g., the processors 403 and/or 404) performing such actions as power amplifier linearization methods using predistortion in the frequency domain.

Other activities may include receiving the time-domain waveform, and re-sampling and discrete-Fourier-transforming it to recover the frequency-domain symbols, which symbols are decoded to generate the input data stream.

FIGS. 5A, 5B, 5C, and 5D together constitute a flow diagram 500 illustrating several methods according to various embodiments of the inventive subject matter.

In 501, a stream of input bits is encoded into a plurality of frequency-domain symbols. Each symbol may comprise a complex number representing a plurality of input bits. The frequency-domain symbols may correspond to constellation points of a QAM, QPSK, or BPSK modulation system, scheme, or protocol.

In 502, a block of the frequency-domain symbols is transformed into a time domain to generate samples of a time-domain waveform representing a sum of orthogonal carrier waveforms. Each carrier waveform may be modulated by a frequency-domain symbol.

In 503, the time-domain waveform samples are predistorted by modifying the frequency-domain symbols before transformation into the time domain. The predistorting is performed in a manner that compensates for a non-linear transfer characteristic of the power amplifier.

In 504, the frequency-domain symbols are modified by replacing one or more frequency-domain symbols with frequency-domain predistortion symbols. The predistortion symbols comprise complex numbers that predistort both the amplitude and the phase of the frequency-domain symbols. The frequency-domain symbols may be modified in accordance with a polynomial approximation of a function inverse to the non-linear transfer characteristic of the power amplifier. The polynomial approximation may be updated by comparing an input and an output of the power amplifier.

The polynomial approximation may be updated by optimizing the coefficients of the polynomial approximation in order to minimize a selected criterion. As an example, the minimized criterion may comprise a mean-square difference between an ideally amplified input signal and an output of the power amplifier. Or the minimized criterion may comprise a mean-square difference between a sample of the time-domain waveform and a corresponding digitized sample of the output of the power amplifier. As yet another alternative, the minimized criterion may comprise a mean-square difference between a frequency-domain symbol and a corresponding symbol recovered from the output signal of the power amplifier.

In 505, the frequency-domain symbols are modified by deriving the frequency-domain predistortion symbols in accordance with a frequency-domain convolution performed on the frequency-domain symbols. The frequency-domain convolution may be performed by an inverse-discrete-Fourier transform, a multiplication of the time-domain signal, and a discrete Fourier transform. The multiplication of the time-domain signal may be performed by indexing into a look-up table. The look-up table may contain products of the multiplication indexed by values of the time-domain signal.

In 506, the time-domain samples are predistorted by adding frequency-domain symbols that are additional to those generated by encoding the stream of input bits. The additional frequency-domain symbols compensate for out-of-band frequency components generated by the non-linear transfer characteristic of the power amplifier.

In 507, the time-domain waveform samples are converted into an analog waveform to drive a power amplifier in order to transmit the analog waveform over a communications channel.

In 508, the flowchart ends. It will be understood that the methods may be continuously or intermittently performed.

It should also be noted that the methods described herein do not have to be executed in the order described, or in any particular order. Moreover, various activities described with respect to the methods identified herein can be executed in serial or parallel fashion. Some activities may be repeated indefinitely, and others may occur only once. For the purposes of this document, the terms "information" and "data" may be used interchangeably. Information, including parameters, commands, operands, and other data, can be sent and received in the form of one or more carrier waves.

Applications that may include the apparatus, systems, and methods of various embodiments of the inventive subject matter include electronic circuitry and components used within a variety of electronic equipment or systems at any hierarchical level, including but not limited to wireless networks, base stations, cellular telephones, other wireless communications equipment, computers, personal digital assistants, pagers, workstations, radios, video and audio players, televisions, other entertainment devices, vehicles, and others. Embodiments may also be used in communication and signal processing circuitry, modems, integrated circuits, processor modules (including multi-processor chips), embedded processors, data switches, and application-specific modules, including multilayer, multi-chip modules. Still other embodiments may be realized. For example, many embodiments include a variety of methods.

Although the inventive subject matter has been described in conjunction with the foregoing specific embodiments, many alternatives, variations, and modifications will be apparent to those of ordinary skill in the art. Such alternatives, variations, and modifications are intended to fall within the scope of the following appended claims. For example, it will be understood that the inventive subject matter may be applied to other multiple-carrier wireless communication systems utilizing multiplexing techniques, such as, but not limited to, discrete multi-tone (DMT) systems.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method comprising:
    predistorting an input signal to a power amplifier generating a non-linear output, the predistortion being performed in the frequency domain by modifying frequency-domain symbols used to modulate individual sub-carriers of an orthogonal frequency division multiplexed signal;
    wherein modifying the frequency-domain symbols comprises replacing one or more frequency-domain symbols with frequency-domain predistortion symbols.

2. The method of claim 1, wherein the input signal comprises a plurality of complex numbers each representing a constellation point corresponding to a respective sub-carrier, and wherein predistorting comprises:
    performing a polynomial approximation of an inverse function of an amplitude transfer characteristic of the power amplifier.

3. The method of claim 1, further comprising:
    inverse-discrete-Fourier transforming the frequency-domain symbols to generate samples of a time-domain waveform representing a sum of orthogonal carrier waveforms.

4. The method of claim 3, wherein each carrier waveform is modulated by a frequency-domain symbol.

5. A method comprising:
    encoding a stream of input bits into a plurality of frequency-domain symbols, wherein each symbol comprises a complex number representing a plurality of the input bits;
    transforming a block of the frequency-domain symbols into a time domain to generate samples of a time-domain waveform representing a sum of orthogonal carrier waveforms, with each carrier waveform being modulated by a frequency-domain symbol;
    converting the time-domain waveform samples into an analog waveform to drive a power amplifier in order to transmit the analog waveform over a communications channel;

predistorting the time-domain waveform samples by modifying the frequency-domain symbols before transformation into the time domain; and modifying the frequency-domain symbols by replacing one or more frequency-domain symbols with frequency-domain predistortion symbols.

6. The method of claim 5, wherein predistorting is performed in a manner that compensates for a non-linear transfer characteristic of the power amplifier.

7. The method of claim 5, wherein the predistortion symbols comprise complex numbers that predistort both the amplitude and phase of the frequency-domain symbols.

8. The method of claim 7 further comprising modifying the frequency-domain symbols by deriving the frequency-domain predistortion symbols in accordance with a frequency-domain convolution performed on the frequency-domain symbols.

9. The method of claim 8 further comprising performing the frequency-domain convolution by an inverse-discrete-Fourier transform, multiplication of the time-domain signal, and a discrete Fourier transform.

10. The method of claim 9 further comprising performing the multiplication of the time-domain signal by indexing into a look-up table, where the look-up table contains products of the multiplication indexed by values of the time-domain signal.

11. The method of claim 5 further comprising predistorting the time-domain waveform samples by adding frequency-domain symbols additional to those generated by encoding the stream of input bits.

12. The method of claim 11, wherein the additional frequency-domain symbols compensate for out-of-band frequency components generated by the non-linear transfer characteristic of the power amplifier.

13. The method of claim 5, wherein the frequency-domain symbols correspond to constellation points of a quadrature-amplitude modulation system.

14. The method of claim 5, wherein the frequency-domain symbols correspond to constellation points of a quadrature phase-shift keying modulation system.

15. The method of claim 5, wherein the frequency-domain symbols correspond to constellation points of a binary phase-shift keying modulation system.

16. The method of claim 5 further comprising modifying the frequency-domain symbols in accordance with a polynomial approximation of a function inverse to the non-linear transfer characteristic of the power amplifier.

17. The method of claim 16 further comprising updating the polynomial approximation by comparing an input and an output of the power amplifier.

18. The method of claim 17 further comprising updating the polynomial approximation by optimizing the coefficients of the polynomial approximation in order to minimize a selected criterion.

19. The method of claim 18, wherein the minimized criterion comprises a mean-square difference between an ideally amplified input signal and an output of the power amplifier.

20. The method of claim 18, wherein the minimized criterion comprises a mean-square difference between a sample of the time-domain waveform and a corresponding digitized sample of the output of the power amplifier.

21. The method of claim 18, wherein the minimized criterion comprises a mean-square difference between a frequency-domain symbol and a corresponding symbol recovered from the output signal of the power amplifier.

22. A system comprising:
a power amplifier to be responsive to an orthogonal frequency division multiplexed input signal and to generate an output signal having a non-linear transfer characteristic;
circuitry to produce predistortion of the input signal, the predistortion being performed in the frequency domain by modifying frequency-domain symbols used to modulate individual sub-carriers of the input signal; and
an omnidirectional antenna coupled to the power amplifier to receive the output signal;
wherein modifying the frequency-domain symbols comprises replacing one or more frequency-domain symbols with frequency-domain predistortion symbols.

23. The system of claim 22, wherein the circuitry predistorts the input signal in a manner that compensates for the non-linear transfer characteristic of the power amplifier.

24. The system of claim 22, wherein the apparatus comprises one of a base station, cellular telephone, personal computer, personal digital assistant, and entertainment device.

25. A system comprising:
a modulator to encode a stream of input bits into a plurality of frequency-domain symbols, wherein each symbol comprises a complex number representing a plurality of the input bits;
an inverse-discrete-Fourier transformer to process a block of the frequency-domain symbols to generate samples of a time-domain waveform representing a sum of orthogonal carrier waveforms, with each carrier waveform being modulated by a frequency-domain symbol;
a digital-to-analog converter to convert the time-domain waveform samples into an analog waveform;
a power amplifier to transmit the analog waveform over a communications channel; and
a predistorter to modify the frequency-domain symbols before inverse-discrete-Fourier transformation in a manner that compensates for a non-linear transfer characteristic of the power amplifier, wherein the predistorter is to modify the frequency-domain symbols by replacing one or more frequency-domain symbols with frequency-domain predistortion symbols.

26. The system of claim 25, wherein the predistortion symbols comprise complex numbers that predistort both the amplitude and phase of the frequency-domain symbols.

27. The system of claim 26, wherein the predistorter is to modify the frequency-domain symbols by deriving the frequency-domain predistortion symbols in accordance with a frequency-domain convolution performed on the frequency-domain symbols.

28. The system of claim 27, wherein the predistorter is to perform the frequency-domain convolution by an inverse-discrete-Fourier transform, multiplication of the time-domain signal, and a discrete Fourier transform.

29. The system of claim 28, wherein the predistorter is to perform the multiplication of the time-domain signal by indexing into a look-up table, where the look-up table contains products of the multiplication indexed by values of the time-domain signal.

30. The system of claim 27, wherein the predistorter is to add frequency-domain symbols additional to those generated by encoding the stream of input bits.

31. The system of claim 30, wherein the additional frequency-domain symbols compensate for out-of-band frequency components generated by the non-linear transfer characteristic of the power amplifier.

32. The system of claim 27, wherein the predistorter is to modify the frequency-domain symbols in accordance with a polynomial approximation of a function inverse to the non-linear transfer characteristic of the power amplifier.

33. The system of claim 32 further comprising a polynomial approximation module to update the polynomial approximation by comparing an input and an output of the power amplifier.

34. The system of claim 33, wherein the polynomial approximation module is to update the polynomial approximation by optimizing the coefficients of the polynomial approximation in order to minimize a selected criterion.

35. The system of claim 34, wherein the minimized criterion comprises a mean-square difference between an ideally amplified input signal and an output of the power amplifier.

36. The system of claim 34, wherein the minimized criterion comprises a mean-square difference between a sample of the time-domain waveform and a corresponding digitized sample of the output of the power amplifier.

37. The system of claim 34, wherein the minimized criterion comprises the mean-square difference between a frequency-domain symbol and a corresponding symbol recovered from the output signal of the power amplifier.

38. An article comprising a machine-accessible medium having associated information, wherein the information, when accessed, results in the machine performing:
   encoding a stream of input bits into a plurality of frequency-domain symbols, wherein each symbol comprises a complex number representing a plurality of the input bits;
   inverse-discrete-Fourier transforming a block of the frequency-domain symbols to generate samples of a time-domain waveform representing a sum of orthogonal carrier waveforms, with each carrier waveform being modulated by a frequency-domain symbol; and
   predistorting the time-domain samples by modifying the frequency-domain symbols before inverse-discrete-Fourier transformation in a manner that compensates for a non-linear transfer characteristic of a power amplifier;
   wherein modifying the frequency-domain symbols comprises replacing one or more frequency-domain symbols with frequency-domain predistortion symbols.

39. The machine-accessible medium of claim 38, wherein the predistortion symbols comprise complex numbers that predistort both the amplitude and phase of the frequency-domain symbols.

40. The machine-accessible medium of claim 39, wherein the machine-accessible medium further includes information, which when accessed by the machine, results in the machine performing:
   modifying the frequency-domain symbols by deriving the frequency-domain predistortion symbols in accordance with a frequency-domain convolution performed on the frequency-domain symbols.

41. The machine-accessible medium of claim 40, wherein the machine-accessible medium further includes information, which when accessed by the machine, results in the machine performing:
   performing the frequency-domain convolution by an inverse-discrete-Fourier transform, multiplication of the time-domain signal, and discrete Fourier transform.

42. A method comprising:
   predistorting an input signal to a power amplifier generating a non-linear output, the predistortion being performed in the frequency domain by modifying frequency-domain symbols used to modulate individual sub-carriers of a multi-carrier wireless communications channel;
   wherein modifying the frequency-domain symbols comprises replacing one or more frequency-domain symbols with frequency-domain predistortion symbols.

43. The method of claim 42, wherein the input signal comprises a plurality of complex numbers each representing a constellation point corresponding to a respective sub-carrier, and wherein predistorting comprises:
   performing a polynomial approximation of an inverse function of an amplitude transfer characteristic of the power amplifier.

44. The method of claim 42, further comprising:
   inverse-discrete-Fourier transforming the frequency-domain symbols to generate samples of a time-domain waveform representing a sum of orthogonal carrier waveforms.

45. The method of claim 44, wherein each carrier waveform is modulated by a frequency-domain symbol.

46. The method of claim 42, wherein the multi-carrier wireless communications channel is one of an orthogonal frequency-division multiplexing channel and a discrete multi-tone channel.

* * * * *